United States Patent [19]

Watanabe

[11] Patent Number: 4,948,255

[45] Date of Patent: Aug. 14, 1990

[54] OPTICAL SENSING DEVICE

[75] Inventor: Masanori Watanabe, Tenri, Japan

[73] Assignee: Sharp Kabushiki Kaisha, Osaka, Japan

[21] Appl. No.: 800,399

[22] Filed: Nov. 21, 1985

[30] Foreign Application Priority Data

Nov. 21, 1984 [JP] Japan .................................. 59-247678

[51] Int. Cl.[5] ............................................... G02F 1/01
[52] U.S. Cl. ....................................... 356/367; 356/33
[58] Field of Search ............... 356/365, 367, 368, 366, 356/33, 34

[56] References Cited

U.S. PATENT DOCUMENTS 3,797,940 3/1974 King ................................... 356/365

FOREIGN PATENT DOCUMENTS

85/03124 7/1985 World Int. Prop. O. .

Primary Examiner—Richard A. Rosenberger

[57] ABSTRACT

An optically sensing device is made up of the sensor materials that cause the value of birefringence to vary itself in accordance with external physical volume; a polarizer and an element provided with two total reflection surfaces causing the beam path to invert its direction by an angle of 180°. The optically sensing device has the capability of setting the phase bias by applying the two total reflection surfaces causing the beam path to invert its direction by an angle of 180°. Since each element has different functions, one functioning as a mirror and the other as a quarterwave plate, the optically sensing device is of extremely simple structure and is compact. In addition, since the optically sensing device provides a constant phase bias unlike the unstable performances of conventional quarterwave plates, it guarantees high-precision performance. Also, the use of inexpensive elements ensures reduced cost. In particular, by effectively combining such selected materials featuring photoelastic and electro-optic effects, the optically sensing device embodied by the present invention is extremely effective for detecting the physical volume of a wide variety of substances.

4 Claims, 2 Drawing Sheets

OPTICAL SENSING DEVICE

BACKGROUND OF THE INVENTION

1. Field of the Invention

The present invention relates to an optically sensing device that optically senses physical volume, more particularly, to an optically sensing device such as uses specific sensor materials whose birefringent value varies with external physical volume.

2. Description of Prior Art

Conventionally, an optically sensing device constructed as in FIG. 1 is well-known. Such a device is provided with a sensor material 2 and a quarterwave plate 3 between the polarizers 1 and 4 to allow the volume of outgoing beams to vary according to variations in sensor material 2. Specifically, the volume of outgoing beams varies in accordance with the phase retardation 8 between two polarized beams, which is generated by birefringence of sensor material 2. If no proper birefringence is present in sensor 2, then the phase retardation $\theta$ starts to vary itself from 0° in response to the variation of external physical volume which starts to vary itself from 0. Since the variation of the beam volume is at its maximum when $\theta = 90°$, in order to securely control the sensitivity at an optimum level, independent of sensor material 2, an element that generates a 90° phase retardation is inserted into the optically sensing device. This is the quarterwave plate 3.

Conventionally, a number of materials having the proper birefringence and specific thickness are suitable for the quarterwave plate 3. Specifically, crystal plate, mica plate, calcite plate, rutile plate, etc., are widely used as high-precision quarterwave plates 3; extended plastic plates are also used for reasons of economy. Nevertheless, these quarterwave plates 3 still face a variety of problems. For example, crystal and mica plates are of monocrystalline structure, and yet, these are not only expensive, but also require extremely delicate processes for obtaining predetermined thickness, thus unavoidably involving expensive processing costs. Similarly, although inexpensive, the quality of extended plastic plates are inconsistent and these are therefore unsuitable where extreme precision is required. Independent of a quarterwave plate that employs birefringence, an element called "Flesnel-rhomb" is well-known. This features the same function as that of the quarterwave plate but is totally different in principle. As shown in FIG. 2, the Flesnel-rhomb employs the phase retardation generated between two polarized beams crossing each other at right angles on total reflection. However, the Flesnel-rhomb 5 requires provision of a specific angle position and an extremely complex value that can only be determined by the refractive index of the medium used, thus, involves very difficult processes. In particular, since the outgoing beams move in parallel with the incident light, "Flesnel-rhomb" was not suitable for practical use. In light of the disadvantage thus mentioned, "Flesnel-rhomb" has rarely been applied to any of optically sensing devices in use today.

OBJECTS AND SUMMARY OF THE INVENTION

Objects of the Invention

One of the primary objects of the present invention is to provide an optically sensing device capable of securely and accurately executing sensing operations using an extremely simplified structure.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from the following detailed description.

SUMMARY OF THE INVENTION

In the light of the disadvantages thus described above, the present invention aims at providing an ideal phase bias to realize optimum sensitivity of an optically sensing device by incorporating an element that causes the beam path to vary 180° by executing total reflection twice, resulting in improved cost efficiency, precision, compactness and practicality and at the same time not requiring a quarterwave plate or "Flesnel-rhomb." A right-angle prism may be made available for the element to cause the beam path to vary by 180° by executing total reflection twice. It should be noted, however, that other shapes which keep the feature of a right-angle prism on the beam path are also suitable.

BRIEF DESCRIPTION OF THE DRAWINGS

The present invention will be better understood from the detailed description given hereinbelow and the accompanying drawings are given by way of illustration only, and thus are not limitative of the present invention and wherein.

DETAILED DESCRIPTION OF THE PREFERRED EMBODIMENTS

Figure 3:
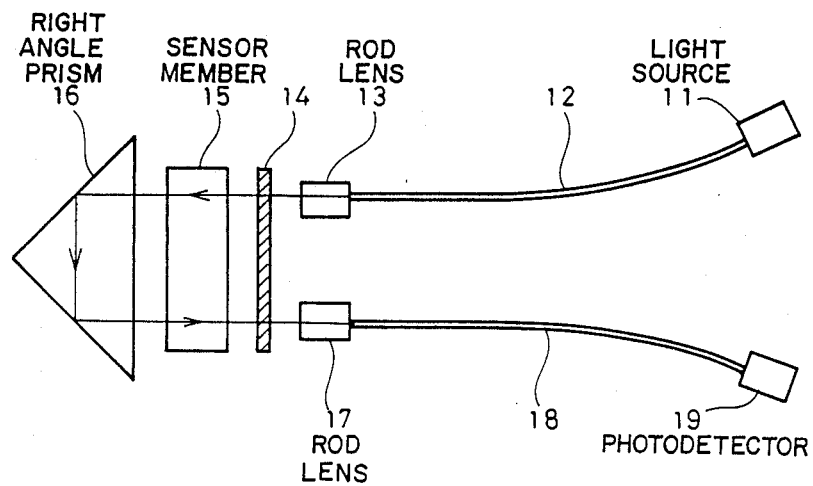
FIG. 3 is a simplified block diagram of an embodiment of an optically sensing device of the present invention.

FIG. 3 is a simplified block diagram of a pressure sensor reflecting the principal preferred embodiment of the present invention. Beams from a light source 11 penetrate a sensor member of photoelastic material 15 and a right-angle prism 16 (optical element) through an optical fiber 12, a rod lens 13, and a polarizer 14, and then reflect themselves against the right-angle prism 16 twice before eventually reaching a photodetector 19 through the photoelastic material 15, the polarizer element 14, another rod lens 17, and an optical fiber 18. Pressure applied to the photoelastic material 15 is measured as the variation of the beam volume reaching the photodetector 19.

A wide variety of materials are available for the photoelastic material 15, including glass, GaP, $LiNbO_3$, $LiTaO_3$, ZnSe, epoxy resin, diallyl phthalate (DAP), acrylic resin, polycarbonate resin, silicon resin. It is desirable that no hydrostatic pressure be applied to the photoelastic material, but it can be applied titled 45° against the polarization axis of the polarizer 14. The photoelastic material 15 and the right-angle prism 16 generate a specific phase retardation between two polarized beams that cross each other in right angle. The polarizer plate 14 causes the phases of the two polarized beams to correctly match when these incident polarized beams cross each other at right angles. The polarizer plate 14 externally emits beams, each having a specific intensity- in accordance with the phase retardation generated by the photoelastic material 15 and the right-angle prism 16.

Figure 4:
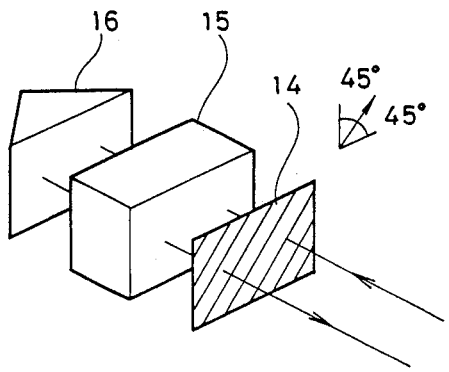
FIG. 4 is a perspective view explaining the relationship between the major components of the optically sensing device shown in FIG. 3.

FIG. 4 shows the relationship between the polarizer plate 14, the photoelastic material 15, and the right-angle prism 16. The relationship shown in FIG. 4 is determined by taking the relationship between the polarized beam and the three elements into consideration.

Assume that a polarized beam with an electrical field vibrating in parallel with the incident plane containing both the incident and outgoing light is determined to be wave P, whereas the polarized beam that crosses wave P at right angles is determined to be wave S. Based on this assumption, the incident light through polarizer plate 14 can be regarded as the input overlapped by waves P and S which respectively have phases identical to each other. When radiating this incident light into the photoelastic element 15 that receives stress in a direction in parallel with the vibrating direction of either wave P or wave S, a specific phase retardation is generated between waves P and S in proportion to the amount of stress. Variations in light-intensity caused by variations in phase retardation is also dependent on the proportion of light intensity between waves P and S. When the proportion of light intensity between wave P and wave S is 1:1, the amount of variation of light intensity is maximized. This is realized by disposing the position of the polarization axis of polarizer 14 at 45° against the incident plane.

Even when the incident light passes through the right-angle prism 16, a specific phase retardation is generated between waves P and S. However, when the polarization axis of polarizer plate 14 is at an angle of either 0° or 90° against the incident plane, the light intensity of either wave P or wave S is reduced to zero, and as a result, the right-angle prism 16 does not function as a phase-biasing element, but merely serves as a mirror. It is therefore, extremely important for the right-angle prism 16 that the polarization axis of the polarizer plate 14 remains at any angle other than 0° or 90° against the incident plane. However, the above-cited conditions needed for maximizing the variations in light intensity of the photoelastic material 15 are also useful for the right-angle prism 16 and can easily be met. Since the condition of the polarized beam is variable in relation to the phase retardation generated by the photoelastic material 15 and the right-angle prism 16, when the beams again pass through the polarizer plate 14, the intensity of the outgoing beams is determined by the phase retardation. Further details of the phase retardation generated by the right-angle prism 16 are described below. Generally, when the beams are fully totally reflected, the phase retardation generated between waves P and S is represented by the equation shown below.

$$\tan \frac{\delta}{2} = \frac{\cos\phi \sqrt{\sin^2\phi - (1/n)^2}}{\sin^2\phi}$$

where n represents the refractive index of the right-angle prism 16 and $\phi$ the angle of incident light against the perpendicular line set onto the light reflective surface.

Normally, the right-angle prism 16 is operated when $\phi$ is 45°. This is represented by the equation shown below.

$$\tan \frac{\delta}{2} = \sqrt{1 - 2(1/n)^2}$$

As described earlier a phase retardation of 90° is ideally suited for the phase bias of the sensor. However, when operating the right-angle prism 16, as is clear from the above equation, phase retardation cannot become 90° after completing one round of the total reflection of beams. Only the condition denoted by n=1.554 allows the phase retardation $2\delta$ to realize 90° after completing two rounds of total reflection. In practice, it is rather difficult to gain access to those materials that can fully satisfy such an ideal refractive index. Therefore, the range of allowable refractive index is calculated below. Assume that a specific condition is provided for, realizing 50% of maximum sensitivity. If the phase bias is $2\delta$, then a 50% minimum of sensitivity can be realized by seeking the value of n that satisfies the equation shown below.

$$\frac{dI}{d\theta} = Io \sin 2\delta > 0.5 \, Io$$

The solution is $1.427 < n < 2.205$. To correctly satisfy the above value, a wide variety of materials is possible including, a variety of optical glasses including BK-7, quartz glass, lead glass or Faraday rotary glass, acousto-optic glass, other conventional glass types, various optical crystals, including fluorite, crystal, calcite, KDP, ADP, KDA, RDA, $Al_2O_3$, MgO, etc., or optical ceramics, or a wide variety of high-polymer materials including acrylic resin or polymethylmethacrylate, polycyclohexylmethacylate, polystylene resin, polycarbonate resin, epoxy resin, polyacrylnitrile, polyvinyl chloride, photo-sensitive resin derived from unsaturated polyester resin, etc. Note that KDP, ADP, KDA, and RDA are respectively the abbreviated names of $KH_2PO_4$, $NH_4H_2PO_4$, $KH_2AsO_4$, and $RbH_2AsO_4$.

Figure 1:
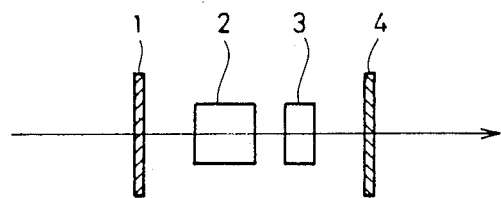
FIG. 1 is a sectional view of a conventional optical sensing device.
Figure 2:
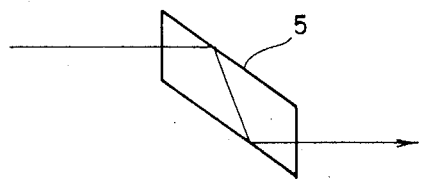
FIG. 2 is a simplified schematic view of a conventional Flesnel-rhomb.
Figure 5:
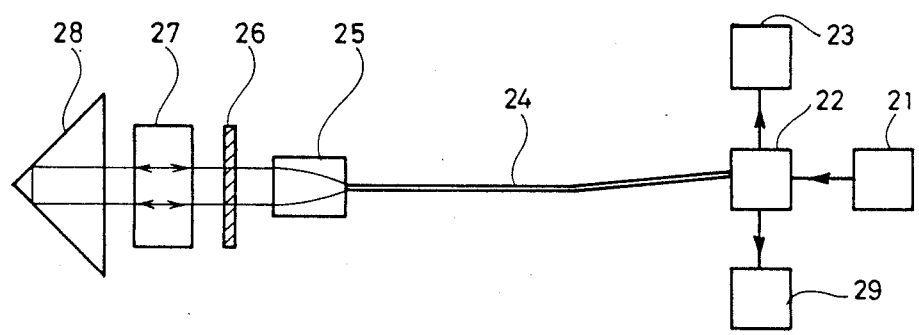
FIG. 5 is a simplified diagram of another embodiment of an optically sensing device of the present invention.

FIG. 5 is a simplified block diagram of a voltage sensor incorporating the preferred embodiment shown in FIG. 4. Beam from a light source 21 are split into two parts by means of a beam splitter 22. One part is routed to a photodetector 23 where it monitors the light volume, whereas the other is transmitted to an electro-optic material 27 such as $LiNbO_3$ or BSO ($Bi_{12}SiO_{20}$) via an optical fiber 24, a rod lens 25, and a polarizer 26. At the same time, external voltage modulates the phase between two polarized beams crossing each other at right angles. Beams are then provided with phase bias by means of a right-angle prism 28, and the beam path is simultaneously reversed 180° to allow the beams to proceed in the reverse direction to the optical material 27, the polarizer 26, the rod lens 25, and the optical fiber 24 before the beams can eventually reach a photodetector 29 via the beam splitter 22. Any variation in voltages applied to the electro-optic material 27 is monitored as a variation in the beam volume arriving at the photodetector 29. Both positional relationship between the polarizer 26 and the right-angle prism 28 remain in the same as described in FIGS. 3 and 4.

The first embodiment cited the name of the pressure sensor, whereas the second preferred embodiment referred to the name of the voltage sensor. However, by substituting the photoelastic material 15 with the electro-optic material 27, the first embodiment may also use the voltage sensor, and the second embodiment may use the pressure sensor. In all the preferred embodiments of the present invention, the optically sensing device employing the photoelastic material 15 does not limit the use of the photoelastic material 15 to the pressure sensor, but allows it to be applied to the acoustic sensor, the distortion sensor, and the displacement sensor as well. In addition, the scope of the optically sensing device embodied by the present invention also allows its application to a temperature sensor, by combining the photoelastic material 15 with materials featuring different coefficients of thermal expansion; to a voltage sensor by combining them 15 with electrically distorting materials; and to a current sensor and magnetic sensor by combining them with magnetically distorted materials.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An optical sensing device comprising:
    a sensor member that causes the phase retardation to vary in accordance with physical values applied thereto, said sensor member being a material which varies its birefringence when said physical values are applied thereto;
    a polarizer positioned on one side of the sensor member, said polarizer having a polarization axis; and
    an optical element positioned on a side of the sensor member opposite to the polarizer, said optical element being provided with two total reflection surfaces causing a beam path to invert itself by 180°, said two total reflection surfaces being disposed at generally 90° with respect to each other thereby forming a generally right angle, wherein a phase bias of substantially 90° is imparted by the reflections from said two total reflection surfaces to orthogonally polarized beams generated in the birefringent material incident on the optical element whereby optical sensitivity is enhanced, said beam passing through said polarizer before and after inversion by said optical element such that intersections of these beam paths with said polarizer established a reference axis, the reference axis passing through both intersections of the beam paths and being generally perpendicular to general directions in which said beam paths move, said polarization axis being located at an angle other than 0° and 90° with respect to said reference axis.

2. The optical sensing device defined in claim 1 wherein said element provided with two total reflection surfaces is a right-angle prism.

3. The optical sensing device defined in claim 1 wherein said sensor member consists of photoelastic materials.

4. The optical sensing device defined in claim 1 wherein said sensor member consists of electro-optic materials.

* * * * *